United States Patent
Felser

(10) Patent No.: US 8,277,575 B2
(45) Date of Patent: Oct. 2, 2012

(54) COMPOUNDS AND METHODS OF FABRICATING COMPOUNDS EXHIBITING GIANT MAGNETORESISTENCE AND SPIN-POLARIZED TUNNELING

(75) Inventor: Claudia Felser, Nieder-Olm (DE)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 12/709,099

(22) Filed: Feb. 19, 2010

(65) Prior Publication Data

US 2011/0084429 A1    Apr. 14, 2011

Related U.S. Application Data

(62) Division of application No. 10/469,098, filed as application No. PCT/EP02/01876 on Feb. 22, 2002, now Pat. No. 7,691,215.

(30) Foreign Application Priority Data

Feb. 23, 2001 (DE) .................................. 101 08 760
Nov. 22, 2001 (DE) .................................. 101 57 172

(51) Int. Cl.
*H01F 1/147* (2006.01)
*H01F 1/047* (2006.01)

(52) U.S. Cl. ........ 148/121; 148/104; 148/425; 148/306; 419/1

(58) Field of Classification Search ........................ None
See application file for complete search history.

(56) References Cited

U.S. PATENT DOCUMENTS

| 5,780,176 A | 7/1998 | Iwasaki et al. |
| 6,069,820 A | 5/2000 | Inomata et al. |
| 6,225,801 B1 | 5/2001 | Jin et al. |
| 6,905,780 B2 | 6/2005 | Yuasa et al. |
| 6,917,088 B2 | 7/2005 | Takahashi et al. |
| 2011/0135960 A1* | 6/2011 | Casper et al. ............ 428/810 |

FOREIGN PATENT DOCUMENTS

| EP | 0877398 A2 | 11/1998 |
| JP | 08-250366 | 9/1996 |
| JP | 10-092639 | 4/1998 |
| JP | 11-055058 | 2/1999 |
| JP | 2001-217483 | 8/2001 |
| JP | 2001-237473 | 8/2001 |
| JP | 2001-308414 | 11/2001 |

(Continued)

OTHER PUBLICATIONS

European Patent Office Action in German language dated Mar. 10, 2008 for Application No. 02 722 119.1-2122.

(Continued)

*Primary Examiner* — John Sheehan
(74) *Attorney, Agent, or Firm* — Alan S. Raynes; Konrad Raynes & Victor LLP

(57) ABSTRACT

The invention relates to inorganic intermetallic compounds having a PMR effect (combined GMR/CMR effect), which are characterized in that they contain at least two elements per formula unit and have a field sensitivity of less than 10% per 0.1 T at temperatures greater than 290 K. The invention also relates to composites consisting of these compounds, to a method for the production thereof and to their use, in particular, as magnetic field sensors or in the domain of spin electronics.

20 Claims, 3 Drawing Sheets

Plots of the results of resistance measurements (measurements of R(B)) on $Co_2Fe_{0.4}Cr_{0.6}Al$ obtained in the absence of a magnetic field and for an external magnetic field of 8 T.

FOREIGN PATENT DOCUMENTS

| JP | 2003-218428 | 7/2003 |
|---|---|---|
| JP | 2003-338644 | 11/2003 |
| JP | 2005-051251 | 2/2005 |

OTHER PUBLICATIONS

Coey, J.M.D., "Powder Magnetoresistance", Journal of Applied Physics, Apr. 15, 1999, pp. 5576-5581, vol. 85, No. 8, American Institute of Physics.

Gupta et al., "Spin-Polarized Transport and Magnetoresistance in Magnetic Oxides", Journal of Magnetism and Magnetic Materials 200, 1999, pp. 24-43, Elsevier Science B.V.

Ishida S., et al. "Search for Half-Metallic Compounds in Co2MnZ (z=iiib,IVb, Vb Element)" Journal of the Physical Society of Japan Bd. 64, Nr. 6, Jun. 1995, JP, pp. 2152-2157.

Kaczmarska K. et al, "Anderson localization of 3d Mn states in semi-Heusler phases", Physical Review B Bd. 60, Nr. 1, Jan. 7, 1999, American Institute of Physics, New York US, pp. 373-382.

T. Nagano et al., "Magnetic Properties of the Fe/sub 2/MnSi- and Fe/sub 2/VSi-based Heusler alloys,"Journal of Magnetism and Magnetic Materials, Feb. 1995, abstract, NL.

E.P. Wolfarth et al., "Ferromagnetic Materials vol. 4", 1988, pp. 259-261, 540-558. Elsevier, Amstrdam NL.

English language abstract for JP11-055058.

Machine English language translation for JP11-055058.

International Search Report, International Application No. PCT/EP02101876, published with application Sep. 6, 2002, 3 pages, WIPO, Geneva.

International Preliminary Examination Report (English translation), International App. No. PCT/EP02/01878, date of completion of report Mar. 4, 2003, WIPO Geneva.

First Non-Final Office Action, dated Sep. 26, 2007, pp. 1-10, for U.S. Appl. No. 10/469,098, filed Dec. 29, 2003 by Claudia Fesler et al.

Response to First Non-Final Office Action, dated Mar. 27, 2008, pp. 1-15, for U.S. Appl. No. 10/469,098, filed Dec. 29, 2003 by Claudia Fesler et al.

Second Non-Final Office Action, dated Jul. 1, 2008, pp. 1-7, for U.S. Appl. No. 10/469,098, filed Dec. 29, 2003 by Claudia Fesler et al.

Response to Second Non-Final Office Action, dated Nov. 3, 2008, pp. 1-3, for U.S. Appl. No. 10/469,098, filed Dec. 29, 2003 by Claudia Fesler et al.

Supplemental Amendment to Second Non-Final Office Action, dated Jan. 12, 2009, pp. 1-11, for U.S. Appl. No. 10/469,098, filed Dec. 29, 2003 by Claudia Fesler et al.

Third Non-Final Office Action, dated Apr. 6, 2009, pp. 1-8, for U.S. Appl. No. 10/469,098, filed Dec. 29, 2003 by Claudia Fesler et al.

Response to Third Non-Final Office Action, dated Jul. 6, 2009, pp. 1-8 for U.S. Appl. No. 10/469,098, filed Dec. 29, 2003 by Claudia Fesler et al.

Notice of Allowance, dated Mar. 1, 2010, pp. 1-4, for U.S. Appl. No. 10/469,098, filed Dec. 29, 2003 by Claudia Fesler et al.

Amendment After Notice of Allowance, dated Feb. 18, 2010, pp. 1-4, for U.S. Appl. No. 10/469,098, filed Dec. 29, 2003 by Claudia Fesler et al.

Second Notice of Allowance, dated Mar. 1, 2010, pp. 1-2, for U.S. Appl. No. 10/469,098, filed Dec. 29, 2003 by Claudia Fesler et al.

* cited by examiner

Plots of the results of resistance measurements (measurements of R(B)) on $Co_2Fe_{0.4}Cr_{0.6}Al$ obtained in the absence of a magnetic field and for an external magnetic field of 8 T.

FIG. 2 Plots of the results of magnetoresistance measurements (measurements of MR(B)) on $Co_2Fe_{0.4}Cr_{0.6}Al$ at 300 K for magnetic fields ranging from −8 T to +8 T.

A plot of the results of resistance measurements (measurements of MR(B)) on $Co_2Fe_{0.4}Cr_{0.6}Al$ at 295 K for magnetic fields ranging from −0.1 T to +0.1 T.

COMPOUNDS AND METHODS OF FABRICATING COMPOUNDS EXHIBITING GIANT MAGNETORESISTENCE AND SPIN-POLARIZED TUNNELING

This application is a divisional of application Ser. No. 10/469,098, filed Dec. 29, 2003, now U.S. Pat. No. 7,691,215, issued on Apr. 6, 2010, which was the National Stage of International Application No. PCT/EP02/01876, filed Feb. 22, 2002, which claims priority in both DE Application No. 101 57 172.0, filed Nov. 22, 2001 and in DE Application No. 101 08 760.8, filed Feb. 23, 2001. All of the above listed applications and U.S. Pat. No. 7,691,215 are hereby incorporated by reference in their entirety.

BACKGROUND

1. Technical Field

The present invention relates to compounds suitable for use in magnetoelectronics.

2. Description of Related Art

Magnetoelectronics is a new field of electronics involving electronic components that employ magnetoresistance effects and spin-polarized electrons, or will employ them in the future. Due to their magnetoresistive properties, such compounds may be employed as, among other things, magnetic-field sensors. The "magnetoresistive properties" involved are a change in electrical resistivity induced by an external magnetic field (magnetoresistance). Due to the spin-polarized tunneling that occurs at room temperature, such compounds may also be employed as basic building blocks in fabricating magnetic random-access memories (MRAM) and spin transistors. "Spin-polarized tunneling" is defined as tunneling (quantum-mechanical penetration of a potential barrier) of electrons, where the probability that tunneling will occur depends upon their spin polarization.

Magnetic-field sensors are used on the magnetic heads of hard-disk drives that are employed as, e.g., external computer storage devices. Conventional magnetic heads detect the strengths and directions of magnetic fields based on a current induced in a coil. However, as recording density increases, the space available for recording a bit decreases, and the resultant magnetic fields will gradually decrease. Ultraresponsive magnetic-field sensors that cannot be manufactured using conventional technologies are required for detecting such weak external magnetic fields. Ultraresponsive magnetic-field sensors that utilize giant magnetoresistance (GMR) or tunneling magnetoresistance (TMR) are known (cf. S. Mengel: "Innovationspotential Magnetoelektronik," *Physikalische Blätter* 55 (3) (1999), pp. 53-56). Magnetic-field sensors that exhibit magnetoresistive effects at temperatures around 200° C. are employed in the automotive industry. Although utilizing colossal magnetoresistance (CMR) in compounds, such as manganese oxides, allows attaining effects that are several orders of magnitude greater, that approach is not yet of technological interest due to the low field responsivities that result.

SUMMARY

One aspect of the invention is an inorganic intermetallic compound exhibiting a PMR-effect that contains at least two chemical elements per formula unit and has an intrinsic field responsivity >10% per 0.1 T at temperatures in excess of 290 K.

Compounds in accordance with examples of the invention, in the form of either bulk materials or composites, may exhibit the following beneficial characteristics:

large negative magnetoresistances ($MR_0$>10%, preferably >20%, and, particularly preferred, >80% (80%, referred to their resistance in the absence of a magnetic field, or 700%, referred to their saturated magnetization)), which are thus much larger than those for GMR-systems, at temperatures exceeding room temperature (preferably at the typical operating-temperature range of read-heads, i.e., around 25° C. to around 55° C.), large magnetoresistive effects over a broad temperature range having a breadth of >100° C., preferably >200° C., and, particularly preferable, >400° C., high field responsivities (>10% per 0.1 T, preferably >20% per 0.1 T, and, particularly preferable, >70% per 0.1 T), a PMR-effect (>5% per 0.1 T, preferably >20% per 0.1 T, and, particularly preferable, >50% per 0.1 T) at room temperature, high resistances to thermal decomposition (up to temperatures of 50° C., preferably up to 80° C., and, particularly preferable, up to 100° C.) and high chemical stabilities (resistance to $H_2O$, $O_2$, and, particularly preferable, resistance to acids and alkalis), compatibility with silicon-processing technologies, and high spin polarizations (>60%, preferably >70%, and, particularly preferable, >90%) at the Fermi energy in order to provide for their broad applicability in magnetoelectronics.

The invention also provides a number of other advantages and benefits, which should be apparent from the following description.

DETAILED DESCRIPTION

Figure 1:
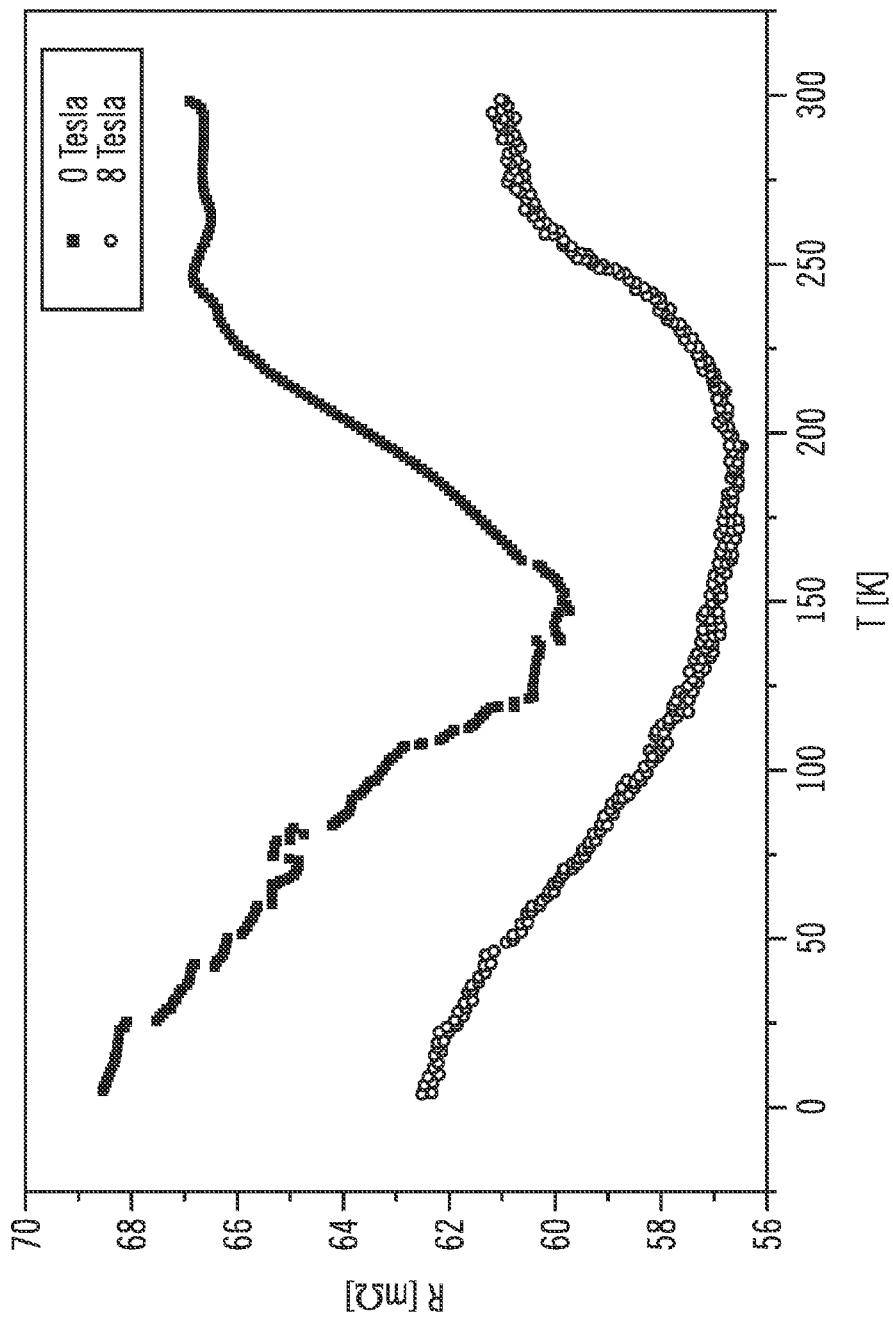
FIG. 1 shows graphs of resistance measurements over a range of temperatures, in the absence of an external magnetic field, and in the presence of an external magnetic field, in accordance with an exemplary embodiment of the invention.

Devices based on GMR and TMR form the basic building blocks for greatly improved MRAMs. MRAMs combine the benefits of semiconductor memories (rapid access) and magnetic materials (high storage densities). Furthermore, the reading process is nondestructive, and magnetic memories are thus nonvolatile. Magnetic memories are rugged, require no external power supplies, and withstand radiation.

In principle, magnetoelectronic effects allow fabricating magnetically switchable spin transistors for electronic circuits have a new type of design, where TMR-devices and/or hybrid magnetic-semiconductor devices might be employed for configuring transistor circuitry. Spin field-effect transistors (Spin-FET) are more simply constructed than the usual metal-oxide semiconductor field-effect transistors (MOSFET), and both of their states (transconducting and non-transconducting) are nonvolatile. Multivalued-logic devices might be configurable by combining magnetic metallic chemical elements with semiconducting chemical elements (cf. G. Bayreuther and S. Mengel: "Magnetoelektronik, Grundlagenforschung—Zukunfts—technologie?," VDI-Technologiezentrum (1998)). A metal or semimetal having a high spin polarization might be a highly beneficial choice for fabricating either TMR-devices or spin transistors. Hybrid magnetic-material-semiconductor structures are based on the idea that a polarizer-analyzer combination for the spins of charge carriers similar to those employed in optics might be configured using magnetic films. The resistance of the resultant hybrid device would vary with the relative orientations of the magnetizations of its two electrodes. However, in order to achieve that, it will be necessary, firstly, to supply spin-polarized currents by injecting spin-polarized charge carriers via the semiconductor layer and, secondly, to provide that the spin polarization of those currents is retained over a distance long enough to allow them to reach the analyzer. Although the latter requirement has already been met, there have been no reports of unoxidized metallic materials that have high (in excess of 70%) spin polarizations at room temperature.

The importance of magnetoresistive materials to magnetic sensors and magnetic data storage has grown immensely over recent years, and such materials have already become of major commercial significance. Materials suitable for fabricating products exhibiting GMR-effects incorporate virtually exclusively materials involving 3d-metals, i.e., metals having incomplete 3d-orbitals, since such materials exhibit the desired magnetic properties and are largely compatible with the silicon-processing techniques. Their major characteristics, such as the magnitudes of their magnetoresistive effects, their maximum operating temperatures (the operating temperatures of the resultant magnetic-field sensors), field responsivities, etc., have been improved over the past few years, although no optimal solution covering all application areas has yet been found.

The aforementioned GMR-effect occurs in multilayer systems. In the simplest case, such multilayer systems consist of a pair of magnetic films, e.g., a pair of iron films, separated by a nonmagnetic film, e.g., a chromium film. The GMR-effect, which has been known since 1987, is presumably an extrinsic interface effect (in the case of multiphase systems) (cf. German Patent DE-A 38 20 475). The resistance of such systems will be low whenever the pair of iron films are ferromagnetically coupled by the chromium film, since electrons will then be able to transit from one iron film to the other without altering their spins. On the other hand, the resistance of such systems will be high if the spins of the two iron films are antiferromagnetically coupled. "Ferromagnetism" is generally defined as a collective magnetism, under which electron spins are aligned parallel to one another for temperatures below the Curie temperature. "Antiferromagnetism" is defined as a collective magnetism, under which electron spins are aligned antiparallel to one another for temperatures below the critical temperature (the Neél temperature). The resistance of an antiparallel-coupled multilayer system, measured between its iron films, may be significantly reduced by an externally applied magnetic field. The external magnetic field forces a ferromagnetic alignment of the spins of both iron films along the field direction. This effect may be utilized to achieve an $MR_0$-effect of at most 10% at room temperature. The GMR-effect is currently already at the engineering-application stage, in particular, for fabricating magnetic-field sensors for the read-heads of hard-disk drives (at IBM, Mainz).

Magnetoresistance is a parameter that describes the percentage change in the resistance of a system in the presence of, and in the absence of, a magnetic field. A "negative magnetoresistance" is defined as a reduction in electrical resistance that occurs in the presence of an external magnetic field, relative to that when no magnetic field is present. Two differing definitions of "percentage magnetoresistance" are in general use. The definition of "percentage magnetoresistance," $MR_0$, that will be employed in the case of the present invention is the difference between the resistance of a device in the presence of a magnetic field and its resistance in the absence of a magnetic field, divided by its resistance in the absence of a magnetic field. Its maximum value is 100%. An alternative definition (e.g., that employed in German Patent DE-A 38 20 475) is employed in the case of the giant-magnetoresistance (GMR) effect. In this case, "percentage magnetoresistance," $MR_P$, is defined as the difference between the resistance of a device in the absence of a magnetic field and its resistance in the presence of a magnetic field, divided by its resistance when the magnetic field is present. Its maximum value may thus be arbitrarily large.

The aforementioned TMR-effect is based on an insulating film sandwiched between a pair of magnetic films. If this insulating film is sufficiently thin, electrons will be able to tunnel through the resultant potential barrier and current will be able to flow between the pair of magnetic films. The tunneling probability is also spin-dependent, which leads to high magnetoresistances for parallel magnetization of the spins in the magnetic tunneling-contact films, compared to those for antiparallel magnetization of their spins. Materials that have exclusively spin-polarized electrons would exhibit a large effect. Since the tunneling probability is spin-dependent, in view of the relation $$MR = \frac{P}{1-P^2},$$

the magnetoresistance, MR, will be a maximum when all spins, P, have the same polarization. However, the aforementioned magnetoresistances are measurable in chemical elements and thin films of chemical elements only.

Large magnetoresistances were discovered in compounds as well in 1993. Discovery of the "colossal magnetoresistance" (CMR) effect in manganese oxides (cf. R. von Helmold, J. Wecker, B. Holzapfel, L. Schulz, and K. Samwer, *Phys. Rev. Lett.* 71 (1993), p. 2331) attracted worldwide interest, since the change in their resistance when an external magnetic field was applied was much greater than for the aforementioned multilayer systems composed of chemical elements. The CMR-effect is an intrinsic effect (an effect occurring within a chemical compound), and the extremely large change in resistance is due to suppression of a metal-insulator transition at the Curie temperature, $T_C$. The "Curie temperature" is defined as the critical temperature, below which a spontaneous magnetization involving a parallel alignment of spin moments on those of neighboring atoms, which is also termed a "ferromagnetic alignment," occurs. At temperatures above $T_C$, spins will be randomly oriented, and compounds that exhibit a CMR-effect will be insulators (semiconductors). At temperatures below $T_C$, they will be ferromagnetic metals. The CMR-effect was first measured for mixed-valency manganese oxides, such as $La_{1-x}Sr_xMnO_3$. The negative MR that occurs in the case of CMR is attributable to the reduction in spin disorientation that occurs. The electrical conductivity that occurs is due to $e_g$-electrons "hopping" between $Mn^{3+}$-sites and $Mn^{4+}$-sites, and that "hopping" occurs only when the magnetic moments of the two Mn-atoms are aligned parallel to one another, as in the ferromagnetic case. A metal-insulator transition occurs at the Curie temperature. In the presence of an applied magnetic field, the probability of "hopping" will increase as the degree of ferromagnetic alignment increases, and resistance will decrease. The effect is thus usually greatest at the Curie temperature. Although engineering applications of the CMR-effect are also thought to be feasible, the greatest effect is usually observed at temperatures below room temperature, rather than at temperatures falling within the operating-temperature ranges of read-heads. Field responsivities are also still too low, and epitaxial growth of the compounds involved on silicon wafers continues to present problems.

Polycrystalline samples or highly compacted pellets of compounds exhibiting the CMR-effect and $CrO_2$ exhibit a so-called "powder-magnetoresistance" (PMR) effect (cf. A. Gupta and J. Z. Sun: "Spin-polarized transport and magnetoresistance in magnetic oxides," *J. Magn. Magn. Mat.* 200 (1999), pp. 24-43). Far below their Curie temperature, these compounds exhibit high polarizations of electrons at the Fermi energy, which leads to samples that have grain boundaries exhibiting large magnetoresistances in weak magnetic fields (as much as 20% at 4 K and 0.1 T). Only some of their totally spin-polarized electrons are able to tunnel to states of neighboring grains that have differently aligned spins. An insulating oxide film probably forms the tunneling barrier. Their measured resistance is thus large. An external magnetic field will align all spins and reduce their resistance, since their conduction electrons will then be able to tunnel to neighboring grains. Nevertheless, all compounds that have become known to date exhibit no noticeable effect at room temperature. Since all such compounds are also oxides, transferring these devices to wafers presents problems. The largest effect at room temperature (6% at 1 T; cf. K.-I. Kobayashi, *Nature* 395 (1998), p. 677) was measured in $Sr_2FeMoO_6$. Composites composed of a metallic material having a high spin polarization and an insulating, or at least semiconducting, material, e.g., an oxide, such as $Al_2O_3$, MgO, or $Cr_2O_3$, a fluoride, such as $MgF_2$, or some other insulating, or semiconducting, compound, such as a polymer or oligomer, such as polystyrene, polyethylene, an epoxy resin, etc, should be suitable materials for use in magnetoelectronics due to their PMR-effects. The insulating material prevents short-circuiting of the metallic particles, and probably also serves as a tunneling barrier.

The problem addressed by the present invention is making available materials that will allow realizing higher (up to 8 Gbits/cm²) recording densities on hard-disk drives than in the case of the hard-disk drives in current use, which are based on a GMR-effect or the TMR-effect and allow reaching recording densities of about 1 Gbit/cm². The materials involved should also exhibit high spin polarizations at room temperature in order to allow their employment as TMR-devices and in spin electronics. High magnetoresistances at temperatures in excess of room temperature are necessary if they are to be employed as magnetic-field sensors in the automotive industry.

There thus existed a need for materials that will exhibit the following properties when combined:
the favorable characteristics of multilayer systems that exhibit a GMR-effect, namely:
high field responsivities,
a large effect at the operating temperatures of read-heads,
a stable effect over a broad temperature range, and
the favorable characteristics of compounds that exhibit a CMR-effect, namely:
an extremely large effect in a bulk material or a composite composed of an insulating material and a metallic material exhibiting a high spin polarization, where the effect will not be strongly dependent upon the thickness of the intervening film, as in the case of the GMR-effect, and
for use in spin electronics, high spin polarization at temperatures as close as possible to room temperature.

The present invention now makes available compounds that combine the favorable characteristics of the GMR-effect and CMR-effect with one another and exhibit high spin polarization at room temperature. Their magnetoresistances exceed those of GMR-systems and TMR-systems by a factor of about three, while providing field responsivities better than those of manganese oxides. Although sensors based on a GMR-effect or TMR-effect employed on hard-disk drives allow reaching recording densities of about 1 Gbit/cm², compounds according to the invention should allow reaching higher recording densities (up to 10 Gbits/cm²). In composite form (granular materials composed of the compound according to the invention and an insulating, or at least semiconducting, material) magnetoresistive effects of as much as 80% (80% of their resistance in the absence of a magnetic field, or 700% of their saturation magnetization) have been measured.

The invention has been based on the following theoretical considerations: An intermetallic compound incorporating 3d-metals as constituents might meet the above requirements, since such compounds might simultaneously exhibit the desired properties of both the metallic, multilayer systems and compounds that exhibit a metal-insulator transition. It will be beneficial if their Curie temperature will continue to exceed room temperature (23° C.) in order that the largest effect will be attained for temperatures falling within the operating-temperature range of read-heads. A Curie temperature in excess of 300° C. would be favorable for spin-polarized tunneling and for the PMR-effect at room temperature. The compounds according to the invention exhibit the effect, virtually independent of temperature, over the temperature range investigated, i.e., temperatures up to 400 K.

An understanding of the theoretical model that describes the physical basis for the CMR-effect will be useful in synthesizing compounds meeting the aforementioned requirements profile. Whether a compound is an insulator, i.e., a material having an even number of valence electrons, or a metal, i.e., a material having an odd number of valence electrons, is a matter of conjecture. If certain 3d-metals or 4f-metals are constituents of a compound, then statements regarding its magnetism may be inferred from the distance between those atoms in the solid state. That such estimates are possible is due to the existence of a relation among the crystalline structure of such a compound, its valence-electron concentration, and its electronic and magnetic properties.

"Valence-electron concentration" is defined as the number of valence electrons per atom in the formula unit involved. "Valence electrons" are defined as electrons in orbitals of chemical elements outside the last, closed, inert-gas shell. In the case of the transition metals, their valence electrons are s-electrons, p-electrons, and d-electrons, and, in the case of the lanthanides, f-electrons as well.

The electronic structure of a solid may be described in terms of its band structure, and may currently be computed with sufficient accuracy. "Band structure" is the solid-state analog of the energy levels of molecules. The electronic structures of solids may be measured using spectroscopic methods, such as photoemission spectroscopy.

Systematic study of the electronic structures of known compounds having the aforementioned electronic and magnetic properties has allowed, for the first time, formulating an initial recipe for synthesizing compounds exhibiting giant magnetoresistances using a "fingerprint" (cf. C. Felser, R. Seshadri, A. Leist, and W. Tremel, *J. Mater. Chem.* 8 (1998), p. 787, and C. Felser and R. Seshadri, *J. Inorg. Mater.* 2 (Raveau Commemorative Volume, 2000), p. 677).

The GMR-effect in the aforementioned Fe—Cr—Fe-system may also be explained on the basis of the electronic structure of chromium and the spin-density wave (to be explained below) and magnetism of iron (cf. P. Bruno and C. Chappert, *Phys. Rev. B* 46 (1992), p. 261).

The "double-exchange" ("double Zener-exchange") mechanism (cf. C. Zener, *Phys. Rev.* 82 (1951), p. 403) is usually invoked in order to explain the giant magnetoresistance of the manganese oxides, the CMR-effect. However, that approach to an explanation is confined to the mixed-valency manganese oxides. There is no general theory.

Spin-density waves, which are largely responsible for the GMR-effect, are also under discussion as the probable cause of high-temperature superconductivity (cf. G. Burdett: Chemical Bonding in Solids. Oxford University Press (1995)). However, superconducting cuprates and manganese oxides exhibiting the CMR-effect are structurally interrelated. Spin-density waves were thought to be coresponsible for giant magnetoresistances as long ago as 1998 (cf. C. Felser, R. Seshadri, A. Leist, and W. Tremel, *J. Mater. Chem.* 8 (1998), p. 787). Spin-density waves are consequences of the unusual electronic structures of manganese oxides. Computations of the electronic structures of these compounds based on band-structure computations allow recognizing whether a given compound will exhibit a spin-density wave. Theoretically, one needs a four-dimensional plot involving the three spatial coordinates (in momentum space) and the energy in order to represent a three-dimensional plot of the electronic structure of a solid. One means for arriving at a three-dimensional representation is using the isoenergetic surface, a surface of constant energy (in momentum space). The isoenergetic surface, which separates occupied states from unoccupied states, is the Fermi surface, and the associated energy is the Fermi energy. Under this representation of electronic structure, spin-density waves are identifiable as parallel surfaces on the isoenergetic surface. Due to the symmetry of their crystalline structures and their valence-electron concentrations, manganese oxides exhibit such a "fingerprint" in their electronic structures. Magnetic manganese oxides that exhibit a CMR-effect also exhibit an additional, local, magnetic moment. "Compounds exhibiting a local magnetic moment" are defined as compounds having unpaired electrons, paramagnetic compounds whose spins are magnetically aligned at temperatures below the critical temperature, $T_C$. Local magnetic moments in manganates are caused by a partially filled electron shell, in this case, the half-filled $t_{2g}$-shell of manganese.

Formation of an antiferromagnetic arrangement may occur in the case of compounds as well, depending upon the ratio of the wavelength of the spin-density wave (a result of their band structure) to the distance between magnetic atoms in the solid. This "fingerprint," i.e., spin-density waves, has been observed in superconductors and magnetic systems exhibiting negative magnetoresistances. Knowledge gained from the electronic structures of superconducting compounds and consistent application of the model have led to prediction, and subsequent experimental verification, of a CMR-effect in $GdI_2$ (cf. C. Felser and R. Seshadri, *J. Mater. Chem.* 9 (1999), p. 459, C. Felser, K. Thieme, and R. Seshadri, *J. Mater. Chem.* 9 (1999), p. 459, and C. Felser, K. Ahn, R. K. Kremer, and R. Seshadri, and A. Simon, *J. Solid State Chem.* 147 (1999), p. 19). $GdI_2$ becomes ferromagnetically arranged at 290 K and exhibits a CMR-effect having a magnetoresistance, $MR_0$, of 70% at room temperature and 7 T. Although this compound was the world-record holder at room temperature until the compound according to the invention was synthesized, engineering applications were precluded due to its chemical reactivity (it reacts with $H_2$, $H_2O$, and $O_2$) and its low field responsivity.

A new, greatly improved, model has meanwhile been developed. In addition to the aforementioned spin-density wave, a saddle point in the band structures of compounds exhibiting the CMR-effect is beneficial. A saddle point, conforming to the mathematical definition of the term, in their spin-polarized band structure leads to a high state density. "State density" is defined as the total number of energy levels falling within a specified energy interval. A high state density (more than three energy levels per elementary cell and eV) at the Fermi energy, the energy that separates occupied states from unoccupied states, is unfavorable for the electronic system and is thus termed an "electronic instability." Incidence of these two types of instability, spin-density waves and saddle points, at the Fermi energy is favorable for the ground-state properties of compounds having unusual electronic and magnetic properties.

The "fingerprint" for compounds exhibiting giant magnetoresistance thus consists of three factors: a saddle point, a spin-density wave, and a local magnetic moment. The saddle point apparently leads to a ferromagnetic coupling among magnetic atoms (cf. Hedin, *J. Magn. Mat.* 177 (1998), p. 599), while the spin-density wave leads to an antiferromagnetic arrangement of the spins of neighboring atoms. This competition between ferromagnetic and antiferromagnetic coupling appears to be the cause of the large change in resistance at the Curie temperature, and is thus responsible for the giant magnetoresistance that occurs in compounds.

If the materials involved also exhibit high spin polarizations at the Fermi energy, magnetoresistance effects will be particularly large. "Spin polarization at a specified energy" is defined as the ratio of the state densities for the two spin orientations at that energy. The maximum value of spin polarization is unity (a nonmagnetic compound has a spin polarization of zero), and magnetoresistance, which, in the case of the PMR-effect and the TMR-effect, would be dependent upon spin polarization, will be maximized, in view of the relation $$MR = \frac{P}{1-P^2}.$$

Furthermore, in addition to the aforementioned, trifactor (saddle point, spin-density wave, and local magnetic moment) "fingerprint," further requirements have, appropriately, arisen. Although, instabilities frequently occur in the band structures of solids, in fact, they will affect their electronic properties only if they occur in the vicinity of the Fermi energy. Although a shift in the Fermi energy can, theoretically, be achieved by doping a compound with electrons or holes, in practice, it frequently is difficult to achieve. The Fermi energy may be shifted toward higher energies by doping with electrons, and shifted toward lower energies by doping with holes, which will allow repositioning the instability in band structure precisely on the Fermi energy. Doping a compound, such as $SrMnO_3$, with electrons involves replacing the corresponding fraction of strontium atoms by lanthanum atoms. The only candidates for such replacements are thus compound systems that may be doped, i.e., that exist for various combinations of chemical elements and in which individual atoms may be replaced by other atoms.

Intermetallic compounds, such as Heusler compounds, accurately meet the prerequisites demanded:
a trifactor "fingerprint" in their band structure, consisting of
a saddle point,
a spin-density wave, and
a local magnetic moment.
They are semimetallic, ferromagnets having
a variable valence-electron concentration,
highly symmetric structures, and
Curie temperatures >500 K.

The prerequisites for potential occurrence of an MR-effect are:
a high field responsivity,
a large effect at the operating temperatures of read heads,
stability of the effect over a broad temperature range, and
an extremely large effect in a bulk or composite material, where the effect should not be strongly dependent upon the thickness of the intervening film, as in the case of the GMR-effect.

In the case of applications to spin electronics: high spin polarization at temperatures close to room temperature.

Intermetallic compounds are a reasonable choice for attaining high field responsivities in the case of compounds exhibiting giant magnetoresistances and, in particular, semimetallic ferromagnets will be found among the Heusler phases. "Heusler phases" are intermetallic compounds having the general composition $X_2YZ$, and crystallize into the $BiF_2$ type of structure (cf. Pearson's Handbook of Crystallographic Data for Intermetallic Phases. ASM International, The Materials Information Society (1991)). Included among intermetallic compounds are compounds involving
a) two or more true metals ($T_1$ and $T_2$),
b) one or more true metals and one or more true metals of the B-subgroups, and
c) two or more metals of the B-subgroups,
where their properties become less metallic and more like those of true chemical compounds when they undergo a transition from Class 1 to Class 3. The classification into true metals and chemical elements of the B-subgroups is based on Table 13.1 of R. C. Evans: Einführung in die Kristallchemie. Walter de Gruyter Verlag, Berlin and New York (1976), p. 276:

| True Metals | | | | | | | | | | Chemical Elements of the B-Subgroups | |
|---|---|---|---|---|---|---|---|---|---|---|---|
| $T_1$ | | | | $T_2$ | | | | | | $B_1$ | $B_2$ |
| Li | Be | | | | | | | | | | |
| Na | Mg | | | | | | | | | Al | Si  S |
| K | Ca | Sc | Ti | V | Cr | Mn | Fe | Co | Ni | Cu | Zn  Ga | Ge  As  Se |
| Rb | Sr | Y | Zr | Nb | Mo | Tc | Ru | Rh | Pd | Ag | Cd  In | Sn  Sb  Te |
| Cs | Ba | La | Hf | Ta | W | Re | Os | Ir | Pt | Au | Hg  Tl | Pb  Bi  Po |

The lanthanides and actinides belong to Class $T_2$.

Cubic structures of the $BiF_2$-type are characterized by four internesting fcc-lattices. X and Y are usually transition metals ($T_2$ in the table above). Y is usually a rare-earth element. Z is a nonmagnetic metal or nonmetal (an element from Subgroup $B_1$ or $B_2$). Due to their magnetic behavior, the magnetooptic Kerr effect, Heusler phases have acquired technological importance. The magnetic properties of most known Heusler phases have thus been rather well investigated. In particular, their ferromagnetic Curie temperatures and magnetic moments are known. However, their electronic properties, such as their electrical conductivities, have been investigated in rare cases only. With the exception of the recently discovered semiconducting, nonmagnetic, $Fe_2Val$, all Heusler compounds that have thus far become known, i.e., several hundred distinct phases, are metals. Several ferromagnetic Heusler compounds have band structures characteristic of semimetallic ferromagnets. The high degrees of symmetry of their cubic structures have also proven favorable, due the occurrence of electronic instabilities. Heusler phases exist over a relatively broad range of valence-electron concentrations, which means that doping them with electrons or holes, as required, should present no problems. Since the magnetic compounds have been rather thoroughly investigated, the Curie temperatures of unknown, new, or doped compounds may be inferred from the ferromagnetic Curie temperatures of known compounds. Band-structure computations for various Heusler compounds have shown that this class of compounds either immediately meets the aforementioned criteria, or will meet them if their valence-electron concentrations are suitably adjusted by varying their elemental compositions. For a valence-electron concentration of 6.95±0.5, preferably 6.95±0.2, in particular, 6.95±0.1, and, much to be preferred, 6.95±0.02, valence electrons per atom in their formula unit, the instabilities involved (saddle points and spin-density waves) occurred at their Fermi energy. Other instabilities in Heusler compounds occur for valence-electron concentrations of 5.5±0.5, 6.95±0.5, preferably 5.5±0.2, in particular, 5.5±0.1, and, much to be preferred, 5.5±0.02, valence electrons per atom in their formula unit, and 7.13±0.5, preferably 7.13±0.2, in particular, 7.13±0.1, and, much to be preferred, 7.13±0.02, valence electrons per atom in their formula unit.

Since known Heusler compounds do not exhibit such valence-electron concentrations (VEC) under all conditions, in particular, under all auxiliary conditions (e.g., a Curie temperature falling within the range applicable to read-heads), doping of the known compounds was necessary, where it was assumed that their band structure would not be altered by doping and only their Fermi energy would be shifted (the "rigid-band-model" assumption). In fact, Heusler compounds synthesized based on the aforementioned theory, $Co_2Cr_{0.6}Fe_{0.4}Al$ (VEC=6.95), $Co_2Cr_{0.6}Fe_{0.4}Ga$ (VEC=6.95), and $Co_2Cr_{0.2}Mn_{0.8}Al$ (VEC=6.95), subsequently exhibited the expected giant magnetoresistances. The investigations of their electronic properties that were conducted showed that, as had been postulated, compounds according to the invention, $Co_2Cr_{0.6}Fe_{0.4}Al$, $Co_2Cr_{0.6}Fe_{0.4}Ga$, and $Co_2Cr_{0.2}Mn_{0.8}Al$, combined the favorable properties of the GMR-effect (high field responsivities) and the CMR-effect (a large effect in a compound). Heusler phases according to the invention exhibit magnetoresistances of the same order of magnitude as those of the manganites (the "colossal-magnetoresistance effect" (CMR-effect)) and field responsivities as high as those of the multilayer systems (the "giant-magnetoresistance effect" (GMR-effect)). Since measurements of the effect were conducted on polycrystalline samples, it may be concluded that spin polarization was nearly 100%. Other compounds according to the invention are, for example, $Co_2Mn_{0.8}Cr_{0.2}Al$, and $Co_2Mn_{0.8}Cr_{0.2}Ga$, for both of which VEC=6.95, and $Co_2MnGe_{0.5}Ga_{0.5}$, $Co_2MnSi_{0.5}Al_{0.5}$, $Co_2MnSn_{0.5}Sn_{0.5}$, $Co_2Mn_{0.5}Cr_{0.5}Si$, $Co_2Mn_{0.5}Fe_{0.5}Al$, $Co_2Mn_{0.5}Fe_{0.5}Ga$, $Co_2Mn_{0.5}Fe_{0.5}In$, $Fe_2CoGe_{0.5}Ga_{0.5}$, and $Fe_{2.5}Co_{0.5}Ga$, for all of which VEC=7.13.

Compounds according to the invention are thus inorganic, intermetallic compounds that contain at least two chemical elements per formula unit and exhibit negative magnetoresistances having field responsivities >5% per 0.1 T, in particular, >10% per 0.1 T, preferably >20% per 0.1 T, and, much to be preferred, >70% per 0.1 T, at room temperature. Admixing oxides enhances the PMR-effect. Preferred compounds according to the invention are intermetallic compounds that exhibit cubic symmetry, preferably having few, or no, structural imperfections. "Structural imperfections" are defined as lattice parameters that differ by <10%, in particular, by <5%, and preferably by <2%. In addition, it has proven to be beneficial if the compounds belong to the Heusler phases. Compounds according to the invention exhibit electronic instabilities (saddle points, spin-density waves, and local magnetic moments) in the vicinity of the Fermi energy. An "instability in the vicinity of the Fermi energy" is defined as an instability differing from the Fermi energy by no more than ±0.5 eV, preferably no more than ±0.2 eV, in particular, no more than ±0.1 eV, and, much to be preferred, no more than ±0.02 eV. It will be beneficial if compounds according to the invention exhibiting the combined CMR/GMR-effect exhibit that effect at temperatures in excess of room temperature (23° C.). Such compounds are characterized by valence-electron concentrations of 6.95±0.5, preferably 6.95±0.2, in particular, 6.95±0.1, and, much to be preferred, 6.95±0.02, electrons per atom in their formula unit. Other instabilities in Heusler compounds, and thus other preferred VECs, are observed for valence-electron concentrations of 5.5±0.5, preferably 5.5±0.2, in particular, 5.5±0.1, and, much to be preferred, 5.5±0.02, electrons per atom in the formula unit, and 7.13±0.5, preferably 7.13±0.2, in particular, 7.13±0.1, and, much to be preferred, 7.13±0.02, electrons per atom in their formula unit. The optimized valence-electron concentrations of specific compounds may be determined from accurate band-structure computations. Optimal properties have thus far been computed for the compounds $Co_2Cr_{0.6}Fe_{0.4}Al$, $Co_2Cr_{0.6}Fe_{0.4}Ga$, and $Co_2Cr_{0.2}Mn_{0.8}Al$, and have also been observed. As a sample computation, Co has 9, elemental Cr has 6, Fe has 8, and Al has 3 valence electrons. A stoichiometric composition of $Co_2Cr_{0.6}Fe_{0.4}Al$ yields $(2\times9)+(0.6\times6)+(0.4\times8)+3=27.8$ valence electrons per formula unit and, following division by 4, 6.95 valence electrons per atom. These valence electrons exhibit a local magnetic moment for a Curie temperature exceeding room temperature (23° C.). The preferred compounds according to the invention, $Co_2Cr_{0.6}Fe_{0.4}Al$, $Co_2Cr_{0.6}Fe_{0.4}Ga$, and $Co_2Cr_{0.2}Mn_{0.8}Al$, are semimetallic ferromagnets, which is why their measured effects are particularly large. Composites according to the invention, which exhibit a PMR-effect >10% per 0.1 T, in particular, >20% per 0.1 T, preferably >50% per 0.1 T, and, much to be preferred, >80% per 0.1 T, at room temperature are granular materials consisting of compounds according to the invention and an insulating material, such as $Al_2O_3$, in admixtures containing mole fractions of, for example, 15%±15%, preferably 15%±10%, in particular, 15%±5%, and, much to be preferred, 15%±2%, of the latter. Magnetoresistive effects ranging up to 80%, referred to their resistance in the absence of a magnetic field, or up to 700%, referred to their saturated magnetization, have been measured for such materials. The effects remain stable over broad temperature ranges whose breadths exceed 50° C., in particular, exceed 100° C., preferably exceed 200° C., and, much to be preferred, exceed 400° C., i.e., the effects vary by <50%, in particular, <20%, and, much to be preferred, <10%, over those temperature ranges. These materials, either in the form of bulk materials embedded in other materials, such as epoxy resins or polymers, or in the form of granular films, may be employed "as is" as magnetic-field sensors for use in magnetoelectronics.

Compounds according to the invention, in the form of either bulk materials or composites, exhibit large negative magnetoresistances ($MR_O$>10%, preferably >20%, and, particularly preferred, >80% (80%, referred to their resistance in the absence of a magnetic field, or 700%, referred to their saturated magnetization)), which are thus much larger than those for GMR-systems, at temperatures exceeding room temperature (preferably at the typical operating-temperature range of read-heads, i.e., around 25° C. to around 55° C.), large magnetoresistive effects over a broad temperature range having a breadth of >100° C., preferably >200° C., and, particularly preferable, >400° C., high field responsivities (>10% per 0.1 T, preferably >20% per 0.1 T, and, particularly preferable, >70% per 0.1 T), a PMR-effect (>5% per 0.1 T, preferably >20% per 0.1 T, and, particularly preferable, >50% per 0.1 T) at room temperature, high resistances to thermal decomposition (up to temperatures of 50° C., preferably up to 80° C., and, particularly preferable, up to 100° C.) and high chemical stabilities (resistance to $H_2O$, $O_2$, and, particularly preferable, resistance to acids and alkalis), compatibility with silicon-processing technologies, and high spin polarizations (>60%, preferably >70%, and, particularly preferable, >90%) at the Fermi energy in order to provide for their broad applicability in magnetoelectronics.

Compounds according to the invention may be assembled from two or more chemical elements, where the types and quantities of the chemical elements involved are chose such that the resultant compounds crystallize into cubic crystals whose lattice constants differ by $\leq$10%, preferably by $\leq$5%, in particular, by $\leq$2%. To a first approximation, their cubic symmetries are determined by the ratios of the atomic radii of the atoms involved (cf. R. C. Evans: Einführung in die Kristallchemie. Walter de Gruyter Verlag, Berlin and New York (1976), p. 276). Ideally, the chemical elements and stoichiometry to be involved are chosen such that the resultant compounds belong to the Heusler phases. The chemical elements chosen should exhibit an electronic instability (saddle point, spin-density wave) in the vicinity, i.e., within ±0.5 eV, preferably within ±0.2 eV, and, particularly preferable, within ±0.1 eV, of the Fermi energy. If that should not be the case, the compounds should beneficially be doped with electrons or holes, in accordance with their theoretically computed electronic structures. The combinations of chemical elements chosen should preferably yield compounds that have a valence-electron concentration of 6.95±0.5, preferably 6.95±0.2, in particular, 6.95±0.1, and, much to be preferred, 6.95±0.02. Alternative valence-electron concentrations are 5.5±0.5, preferably 5.5±0.2, in particular, 5.5±0.1, and, much to be preferred, 5.5±0.02, and 7.13±0.5, preferably 7.13±0.2, in particular, 7.13±0.1, and, much to be preferred, 7.13±0.02, valence electrons per atom in the formula unit. It would be beneficial if the resultant compounds would have a local magnetic moment and a Curie temperature exceeding room temperature. From these synthetic compounds, one then selects those that are semimetallic ferromagnets, which will be those compounds that have state densities for a single spin orientation only at their Fermi energy.

In the following, the invention will be explained in greater detail, based on examples.

EXAMPLES

The compounds involved are synthesized from the chemical elements to be involved, in accordance with their stoichiometric ratios. Measured quantities are pressed into pellets and fused for around 30 seconds in an inert-gas atmosphere using an arc welder. It will be beneficial if this process is repeated several times in order to homogenize the samples. The resultant weight losses will usually be less than 5%. Tempering the samples at high temperatures for short periods has been found to be beneficial. Samples in quartz ampoules that were tempered in vacuum at 800° C. for 5 days exhibited reduced effects, although their X-ray-diffraction patterns indicated no changes in their crystalline structure. Their magnetoresistive properties were investigated by conducting electrical-resistance measurements, both in the presence of an external magnetic field and in the absence of an external magnetic field. These measurements of electrical resistance on samples were performed in an Oxford Instruments helium cryostat using the four-point method, and covered the temperature range 300 K to 4 K. R(T)-curves were recorded for zero magnetic field and a magnetic field of 8 T. The B-field dependence of their electrical resistance was also measured at selected temperatures for applied magnetic fields ranging from −8 T to +8 T. The fused, globular samples were ground using a mortar and pressed into 8-mm-diameter pellets around 1 mm thick using an applied force of 5 metric tons prior to the investigations of the behaviors of their electrical resistance.

Example 1

$Co_2Cr_{0.6}Fe_{0.4}Al$

A total of 2 g of this compound was synthesized from the chemical elements involved (99.8-%-purity Co, supplied by Alfa Metals, Karlsruhe, 99.8-%-purity Cr, also supplied by Alfa Metals, Karlsruhe, 99.99-%-purity Al, supplied by Chempur, Karlsruhe, and 99.9-%-purity Fe, supplied by Alfa Metals, Karlsruhe) in accordance with its stoichiometric ratios. Pellets were pressed from weighed quantities and fused for about 30 seconds in a 700-mbar argon atmosphere using an arc welder operated at a current of 65 A and a voltage of 20 V. That process was repeated three times in order to homogenize the samples. The weight losses involved were less than 2%. The purity of the product was checked using Cu—$K_\alpha$-radiation on a Siemens D5000 X-ray powder diffractometer. The $Co_2Cr_{0.6}Fe_{0.4}Al$-phase (a Heusler phase having a $Co_2CrAl$-structure and cubic symmetry, with a=0.5724 nm) exhibited no impurities. Its R(T)-curve for 0 T is shown in FIG. 1. A plot of its electrical resistance versus temperature in the absence of an external magnetic field exhibits a broad, local maximum at 300 K. Its electric resistance decreases as its temperature decreases until a temperature of about 150 K is reached and then increases as its temperature is further reduced, which is an indication of active behavior.

Figure 2:
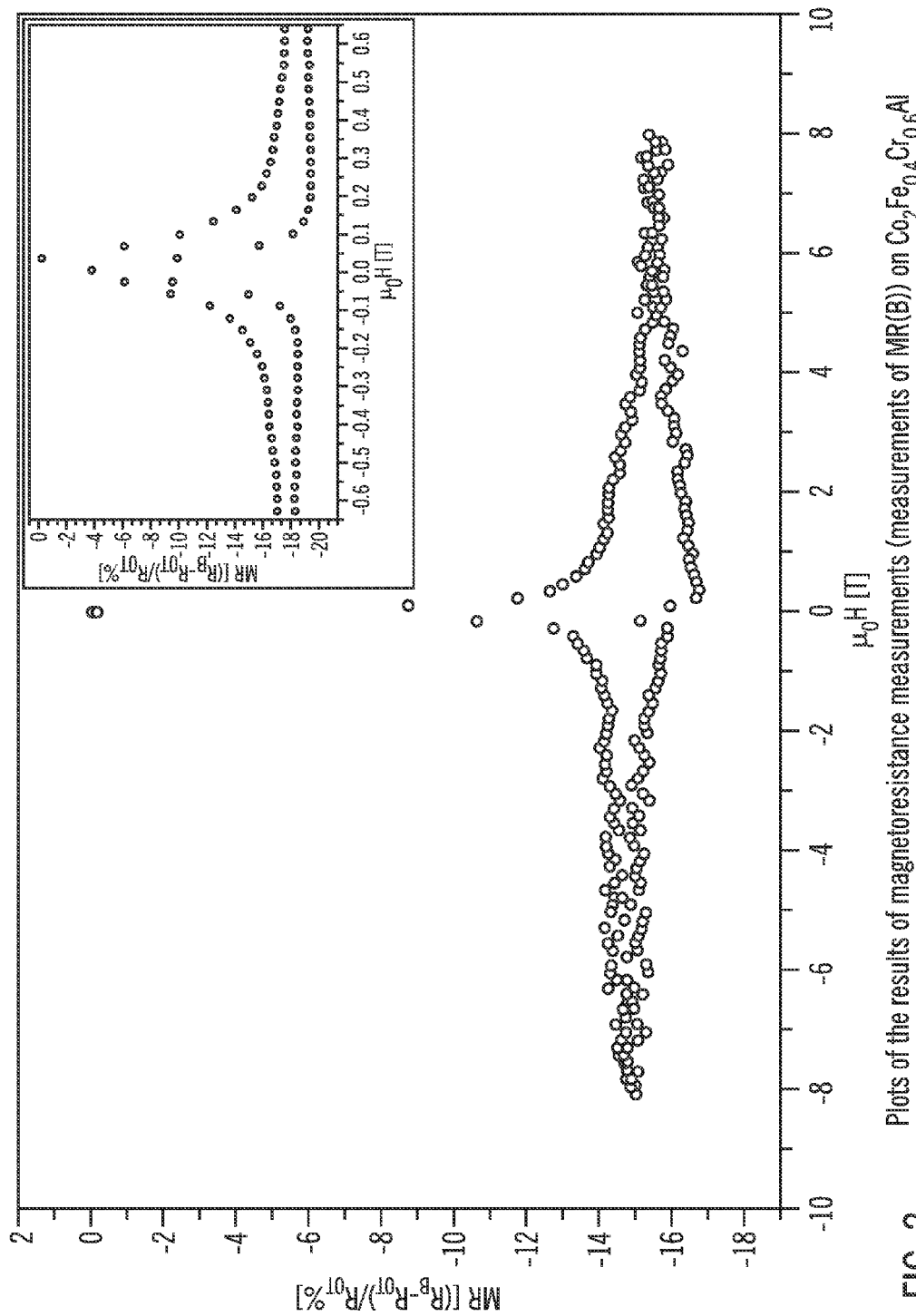
FIG. 2 is a graph of magnetoresistance measurements over a range of magnetic field strengths, in accordance with an exemplary embodiment of the invention.

Applying an external magnetic field of 8 T reduces its resistance at all temperatures and suppresses the sharp transition at 150 K, which smoothes out the local minimum and shifts it toward higher temperatures (cf. FIG. 1). Measurements of the magnetic-field dependence of its magnetoresistance at 4 K yielded a negative magnetoresistance of nearly 10% at a magnetic flux density of 2 T that increased with increasing temperature to 12% at 200 K and nearly 20% at 300 K (cf. FIG. 2). Measurements conducted over the range −0.1 T to +0.1 T yielded an extraordinarily high field responsivity for this compound. Saturations at effects in excess of 20% and of 10% were obtained for magnetic flux densities of 0.1 T and about 0.03 T, respectively.

Example 2

$Co_2Cr_{0.6}Fe_{0.4}Al$+10%, by mole fraction, $Al_2O_3$

The compound $Co_2Cr_{0.6}Fe_{0.4}Al$ was prepared as described under Example 1. The resultant product was finely ground using a mortar and homogenized with 15%, by mole fraction, 99.9-%-purity $Al_2O_3$ supplied by Chempur. This admixture was then pressed into a pellet.

Figure 3:
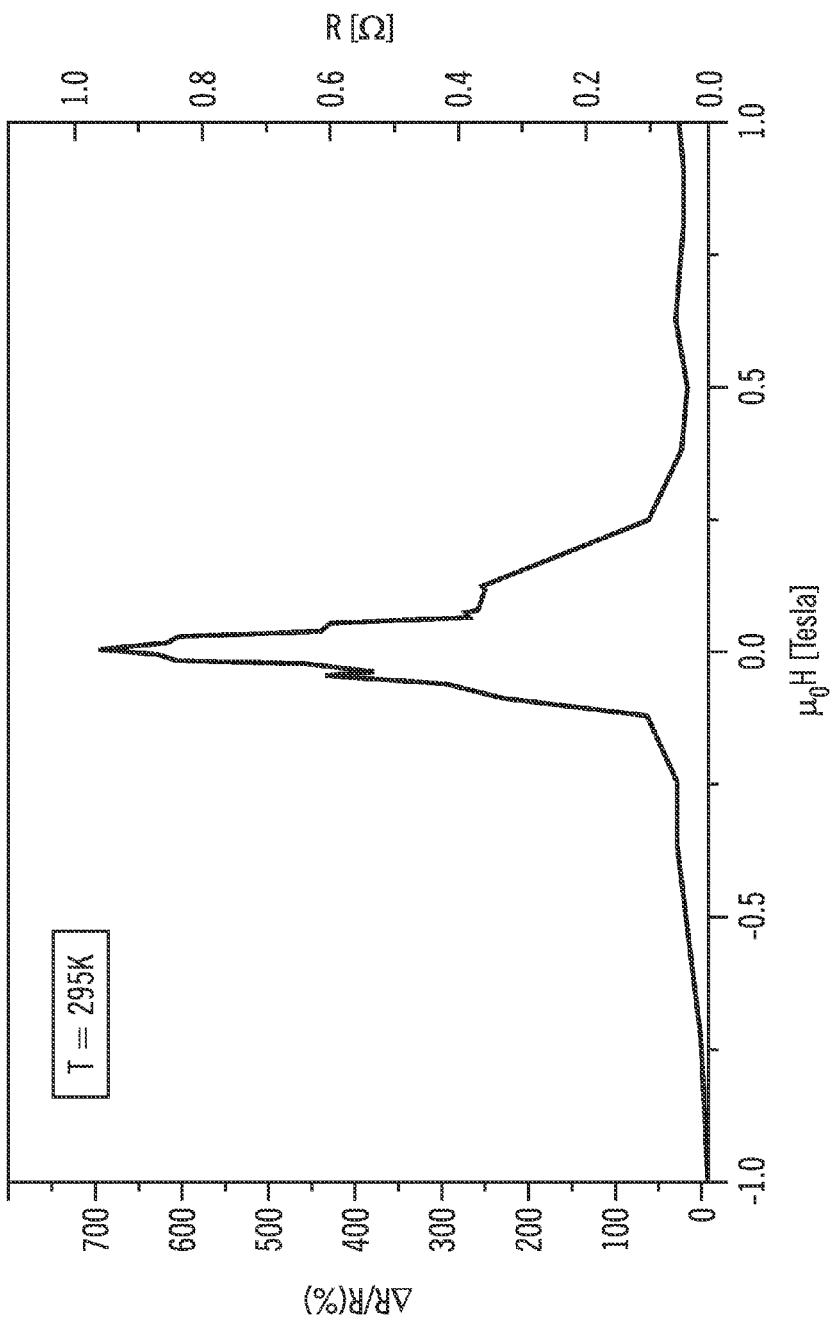
FIG. 3 is a graph of resistance measurements over a range of magnetic field strengths, in accordance with an exemplary embodiment of the invention.

The results of R(B)-measurements on this sample at 295 K are shown in FIG. 3. Observation of the field dependence of its magnetoresistance at 295 K yielded a negative magnetoresistance of nearly 700%, referred to its saturation magnetization, at 0.1 T. Measurements conducted over the range −0.1 T to +0.1 T yielded an extraordinarily high field responsivity for this compound. A saturation at an effect in excess of 40% was measured for a magnetic flux density of 0.05 T.

Aspects of the invention are exemplified in the following entries:

Entry 1. An inorganic intermetallic compound exhibiting a PMR-effect that contains at least two chemical elements per formula unit and has an intrinsic field responsivity >10% per 0.1 T at temperatures in excess of 290 K.

Entry 2. A compound according to entry 1 having cubic symmetry, and whose lattice constants differ by no more than 10%.

Entry 3. A compound according to entry 1 or entry 2 belonging to the class of Heusler phases.

Entry 4. A compound according to entry 1, entry 2, or entry 3 that has a saddle point and a spin-density wave in its band structure in the vicinity of the Fermi energy, both of which fall within ±0.5 eV thereof.

Entry 5. Compounds according to any of entries 1-4, for which the CMR/GMR-effect occurs at room temperature (23° C.) and higher temperatures.

Entry 6. A compound according to any of entries 1-5 having a valence-electron concentration of 6.95±0.5 per atom in its formula unit.

Entry 7. A compound according to any of entries 1-5 having a valence-electron concentration of 5.5±0.5 per atom in its formula unit.

Entry 8. A compound according to any of entries 1-5 having a valence-electron concentration of 7.13±0.5 per atom in its formula unit.

Entry 9. A compound according to any of entries 1-8 having a local magnetic moment.

Entry 10. A compound according to any of entries 1-9 whose Curie temperature exceeds room temperature (23° C.).

Entry 11. A compound according to any of entries 1-10 that is a ferromagnetic semimetal.

Entry 12. Compounds having the formulae $Co_2Cr_{0.6}Fe_{0.4}Al$, $Co_2Cr_{0.2}Mn_{0.8}Al$, $Co_2Cr_{0.6}Fe_{0.4}Ga$, $Co_2Mn_{0.8}Cr_{0.2}Al$, $Co_2Mn_{0.8}Cr_{0.2}Ga$, $Co_2MnGe_{0.5}Ga_{0.5}$, $Co_2MnSi_{9.5}Al_{0.5}$, $Co_2MnSn_{0.5}In_{0.5}$, $Co_2Mn_{0.5}Cr_{0.5}Si$, $Co_2Mn_{0.5}Fe_{0.5}Al$, $Co_2Mn_{0.5}Fe_{0.5}Ga$, $Co_2Mn_{0.5}Fe_{0.5}In$, $Fe_2CoGe_{0.5}Ga_{0.5}$, or $Fe_{2.5}Co_{0.5}Ga$.

Entry 13. A composite composed of at least one compound according to entry 1 and at least one insulating or semiconducting substance.

Entry 14. A composite according to entry 13, wherein the insulating or semiconducting substance employed is employed in a mole fraction of 15% or more, referred to the quantity of the compound according to entry 1 employed.

Entry 15. A composite according to entry 13 or entry 14, wherein the insulating or semiconducting substance is chosen from one or more of the following types of substances: oxides, fluorides, polymers, or oligomers.

Entry 16. A composite according to any of entries 13-15 that exhibits a PMR-effect and has a field responsivity >10% per 0.1 T at temperatures in excess of 290 K.

Entry 17. A composite according to any of entries 13-16 whose PMR-effect occurs at room temperature (23° C.) and higher temperatures.

Entry 18. A method for manufacturing a compound according to entry 1, wherein the compound is manufactured from two or more different chemical elements, where the types and quantities of the chemical elements are chosen such that
  the resultant compound crystallizes into cubic crystals whose lattice constants differ by no more than 10%,
  the compound belongs to the class of Heusler phases, and
  the compound has an electronic instability in the vicinity of (within ±0.5 eV of) the Fermi energy.
Entry 19. A method according to entry 18, wherein the types and quantities of the chemical elements are chosen such that the resultant compound has a valence electron concentration of 6.95±0.5.
Entry 20. A method according to entry 18, wherein the types and quantities of the chemical elements are chosen such that the resultant compound has a valence electron concentration of 5.5±0.5.
Entry 21. A method according to entry 18, wherein the types and quantities of the chemical elements are chosen such that the resultant compound has a valence electron concentration of 7.13±0.5.
Entry 22. A method according to entries 18-21, wherein the compound is doped with electrons or holes.
Entry 23. A method according to any of entries 18-22, wherein the types and quantities of the chemical elements are chosen such that the resultant compound has
  (a) a local magnetic moment and
  (b) a Curie temperature in excess of room temperature.
Entry 24. A method according to any of entries 18-23, wherein the types and quantities of the chemical elements are chosen such that the resultant compound is a ferromagnetic semimetal.
Entry 25. Employment of compounds or composites according to any of entries 1-17 for manufacturing read-heads employed on storage devices.
Entry 26. Employment of compounds or composites according to any of entries 1-17 as magnetic-field sensors.
Entry 27. Employment of compounds or composites according to any of entries 1-17 in spin electronics.
Entry 28. Employment of compounds or composites according to any of entries 1-17 for manufacturing TMR-devices.
Entry 29. Employment of compounds having cubic symmetry, a combined PMR-effect, and an intrinsic field responsivity >10% per 0.1 T as magnetic-field sensors.
Entry 30. Employment of compounds having cubic symmetry, combined GMR/CMR-PMR-effects, and an intrinsic field responsivity >10% per 0.1 T in spin electronics.
Entry 31. Employment of compounds according to entry 30 for manufacturing TMR-devices.

What is claimed is:

1. A method comprising:
  mixing measured quantities of a plurality of different chemical elements together and forming the mixture into a body;
  applying heat to the body and forming an inorganic intermetallic compound;
  wherein the compound is formed to have an intrinsic field responsivity greater than 10% per 0.1 T at temperatures in excess of 290 K; and
  wherein the compound is formed to have a formula selected from the group consisting of $Co_2Cr_{0.6}Fe_{0.4}Al$, $Co_2Cr_{0.6}Fe_{0.4}Ga$, and $Co_2Cr_{0.2}Mn_{0.8}Al$.

2. The method of claim 1, wherein the compound is formed to have the formula $Co_2Cr_{0.6}Fe_{0.4}Al$.

3. The method of claim 1, wherein the compound is formed to have the formula $Co_2Cr_{0.6}Fe_{0.4}Ga$.

4. The method of claim 1, wherein the compound is formed to have the formula $Co_2Cr_{0.2}Mn_{0.8}Al$.

5. The method of claim 1, further comprising doping the compound with one of electrons or holes.

6. The method of claim 1, wherein the compound is formed to have a valence-electron concentration of 6.95±0.5 per atom in its formula unit.

7. The method of claim 1, wherein the compound is formed to have a local magnetic moment, and a Curie temperature in excess of room temperature.

8. The method of claim 1, wherein the compound is formed to have cubic symmetry, and wherein the lattice constants of the compound differ by no more than about 10%.

9. The method of claim 1, wherein the compound is formed to include a band structure that has a saddle point and a spin-density wave, and wherein the saddle point and the spin-density wave are both within ±0.5 eV of a Fermi energy of the compound.

10. The method of claim 1, wherein the applying heat to the body and forming an inorganic intermetallic compound includes heating the body using an arc welder.

11. The method of claim 1, further comprising granulating the compound and mixing the compound with at least one substance selected from the group consisting of insulating substances and semiconductor substances to form a composite.

12. The method of claim 11, wherein the at least one substance is employed in a mole fraction of 15% or more to form the composite.

13. The method of claim 11, wherein the at least one substance selected from the group consisting of insulating substances and semiconducting substances is selected from the group consisting of oxides, fluorides, polymers, and oligomers.

14. A method comprising:
  mixing measured quantities of a plurality of different chemical elements together and forming the mixture into a body;
  applying heat to the body and forming an inorganic intermetallic compound;
  wherein the compound is formed to have an intrinsic field responsivity greater than 10% per 0.1 T at temperatures in excess of 290 K; and
  wherein the compound is formed to have a formula selected from the group consisting of $Co_2Mn_{0.8}Cr_{0.2}Ga$, $Co_2MnGe_{0.5}Ga_{0.5}$, $Co_2MnSi_{0.5}Al_{0.5}$, $Co_2MnSn_{0.5}In_{0.5}$, $Co_2Mn_{0.5}Cr_{0.5}Si$, $Co_2Mn_{0.5}Fe_{0.5}Al$, $Co_2Mn_{0.5}Fe_{0.5}Ga$, $Co_2Mn_{0.5}Fe_{0.5}In$, $Fe_2CoGe_{0.5}Ga_{0.5}$, and $Fe_{2.5}Co_{0.5}Ga$.

15. The method of claim 14, further comprising doping the compound with one of electrons or holes.

16. The method of claim 14, wherein the compound is formed to have a valence-electron concentration of 6.95±0.5 per atom in its formula unit.

17. The method of claim 14, wherein the compound is formed to have a local magnetic moment, and a Curie temperature in excess of room temperature.

18. The method of claim 14, wherein the compound is formed to include a band structure that has a saddle point and a spin-density wave, and wherein the saddle point and the spin-density wave are both within ±0.5 eV of a Fermi energy of the compound.

19. The method of claim 14, wherein the applying heat to the body and forming an inorganic intermetallic compound includes heating the body using an arc welder.

20. The method of claim 14, further comprising granulating the compound and mixing the compound with at least one substance selected from the group consisting of insulating substances and semiconductor substances to form a composite.

* * * * *